United States Patent
Wang

(10) Patent No.: US 6,440,809 B1
(45) Date of Patent: Aug. 27, 2002

(54) METHOD OF PREVENTING FLUORINE IONS FROM RESIDING IN A GATE TO RESULT IN BORON ION PENETRATION INTO A GATE OXIDE

(75) Inventor: Cheng-Lieh Wang, Tao-Yuan (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/803,888

(22) Filed: Mar. 13, 2001

(51) Int. Cl.⁷ .......................................... H01L 21/336
(52) U.S. Cl. ...................... 438/305; 438/309; 438/595; 438/655; 438/660; 438/663; 438/682; 438/712
(58) Field of Search ................... 438/305, 712, 438/595, 655, 660, 663, 682, 309

(56) References Cited

U.S. PATENT DOCUMENTS

| | | | |
|---|---|---|---|
| 6,013,569 A | * | 1/2000 | Lur et al. ..................... 438/595 |
| 6,228,757 B1 | * | 5/2001 | Sengupta et al. ........... 438/622 |
| 6,238,988 B1 | * | 5/2001 | Hsiao et al. ................ 438/305 |
| 2001/0034136 A1 | * | 10/2001 | Kim et al. .................. 438/712 |

* cited by examiner

*Primary Examiner*—Richard Elms
*Assistant Examiner*—Pho M. Luu
(74) *Attorney, Agent, or Firm*—Winston Hsu

(57) ABSTRACT

The present invention provides a method of preventing fluorine ions from residing in a gate to result in boron ion penetration into a gate oxide on a semiconductor wafer. A substrate, an oxide layer, a conductive layer, an anti-reflection coating (ARC), and a photoresist layer positioned on the ARC defining patterns of a gate, are formed, respectively, on the semiconductor wafer. The method first involves an etching process to remove portions of both the ARC and the conductive layer uncovered by the photoresist layer to form the gate and a gate oxide layer. After the photoresist layer is stripped, an ion implantation process is performed using the gate covered by the ARC as hard mask and boron fluoride ($BF_2^+$) as the dopant to form lightly doped drains (LDD) in the substrate adjacent to the gate. Then, a spacer is formed around the gate after the ARC is removed. Finally, the method is completed with the formation of a source and a drain in the substrate adjacent to the spacer after the ARC is stripped.

3 Claims, 5 Drawing Sheets

METHOD OF PREVENTING FLUORINE IONS FROM RESIDING IN A GATE TO RESULT IN BORON ION PENETRATION INTO A GATE OXIDE

BACKGROUND OF THE INVENTION

1. Field of the invention

The present invention relates to a method of preventing ionic penetration into a gate oxide, more specifically, a method of preventing fluorine ions from residing in a gate to result in boron ion penetration into a gate oxide.

2. Description of the Prior Art

A metal-oxide semiconductor (MOS) is a very common electrical device in integrated circuits. A gate, a source, and a drain together comprise the MOS transistor to form a unit with four nodes. By utilizing channel effects generated by the gate of the MOS under different gate voltages, the MOS is often made to function as a digital solid switch. Both increasing complexity and precision in the development of integrated circuits has made controlling the manufacturing process of MOS transistors an important issue.

Please refer to FIG. 1 to FIG. 5 of the cross-sectional views of forming a MOS transistor according to the prior art. As shown in FIG. 1, a semiconductor wafer 10 has an oxide layer 14, a conductive layer 16, and an anti-reflection coating (ARC) 18 composed of silicon-oxy-nitride ($SiO_xN_y$) and formed by a plasma-enhanced chemical vapor deposition (PECVD) process positioned, respectively, on a substrate 10.

As shown in FIG. 2, a patterned photoresist layer 20 is formed in a predetermined area on the ARC 18 to define patterns of a gate 22. As shown in FIG. 3, an etching process is performed to remove portions of both the ARC 18 and the conductive layer 16 uncovered by the photoresist layer 20. The gate 22 and the gate oxide layer 24, composed of the remaining portions of the conductive layer 16 and the oxide layer 14 respectively, are thus formed on the surface of the substrate 12.

As shown in FIG. 4, after stripping both the photoresist layer 20 and the ARC 18, a first ion implantation process is performed using the gate 22 as a hard mask and boron fluoride ($BF_2^+$) as the dopant to form lightly doped drains (LDD) 26 of the MOS transistor in the substrate 12 adjacent to the gate 22. A spacer 27 is then formed around the gate 22.

Finally, as shown in FIG. 5, a second ion implantation is performed using the gate 22 and the spacer 27 as a hard mask and boron (B) as the dopant to form a source 28 and a drain 29 of the MOS transistor in the substrate 12 adjacent to the spacer 27.

However, when the first ion implantation process is performed using the gate 22 as a hard mask and boron fluoride ($BF_2^+$) as the dopant to form the LDD 26 of the MOS transistor in the substrate 12 adjacent to the gate 22, fluorine ions can easily penetrate into the gate 22. In the subsequent second ion implantation process, the boron ions also penetrate into the gate 22. Thus, threshold voltage change, leakage current, and capacitance-voltage curve distortion due to boron ion penetration into the gate oxide layer 24, are enhanced by the fluorine ions that have previously penetrated into the gate 22 so as to cause a defect in the MOS transistor.

SUMMARY OF THE INVENTION

It is therefore a primary object of the present invention to provide a method of preventing fluorine ions from residing in a gate to result in boron ion penetration into a gate oxide.

In the preferred embodiment of the present invention, a substrate, an oxide layer, a conductive layer, an anti-reflection coating (ARC), and a photoresist layer defining patterns of a gate are formed, respectively, on a semiconductor wafer. An etching process is performed to remove portions of both the ARC and the conductive layer uncovered by the photoresist layer to form the gate and a gate oxide layer composed of the residual conductive layer and the oxide layer, respectively. After the photoresist layer is stripped, an ion implantation process is performed using the gate covered by the ARC as hard mask and boron fluoride ($BF_2^+$) as the dopant to form lightly doped drains (LDD) in the substrate adjacent the gate. After the ARC is removed, a spacer is formed around the gate. Finally, the method is completed with the formation of a source and a drain in the substrate adjacent to the spacer after the ARC is stripped.

It is an advantage of the present invention against the prior art that the LDD of the MOS transistor is formed by performing the first ion implantation process, using instead the gate covered by the ARC as a hard mask and boron fluoride ($BF_2^+$) as the dopant. Therefore, fluorine ion penetration, leading to boron ion penetration into the gate oxide and causing threshold voltage change, leakage current, and capacitance-voltage curve distortion, are prevented.

These and other objectives of the present invention will no doubt become obvious to those of ordinary skill in the art after reading the following detailed description of the preferred embodiment, which is illustrated in the multiple figures and drawings.

DETAILED DESCRIPTION OF THE PREFERRED EMBODIMENT

Figure 1:
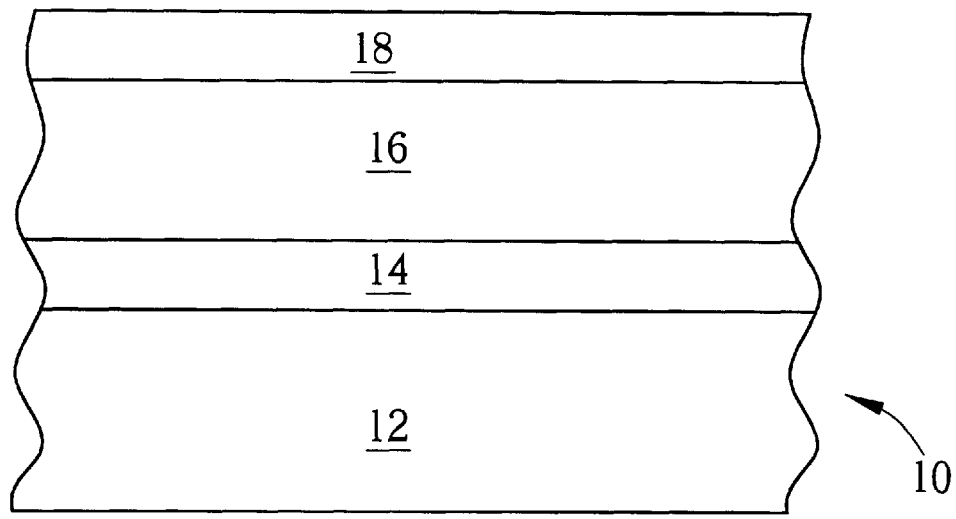
FIG. 1 to FIG. 5 are the cross-sectional views of forming a MOS transistor according to the prior art.
Figure 2:
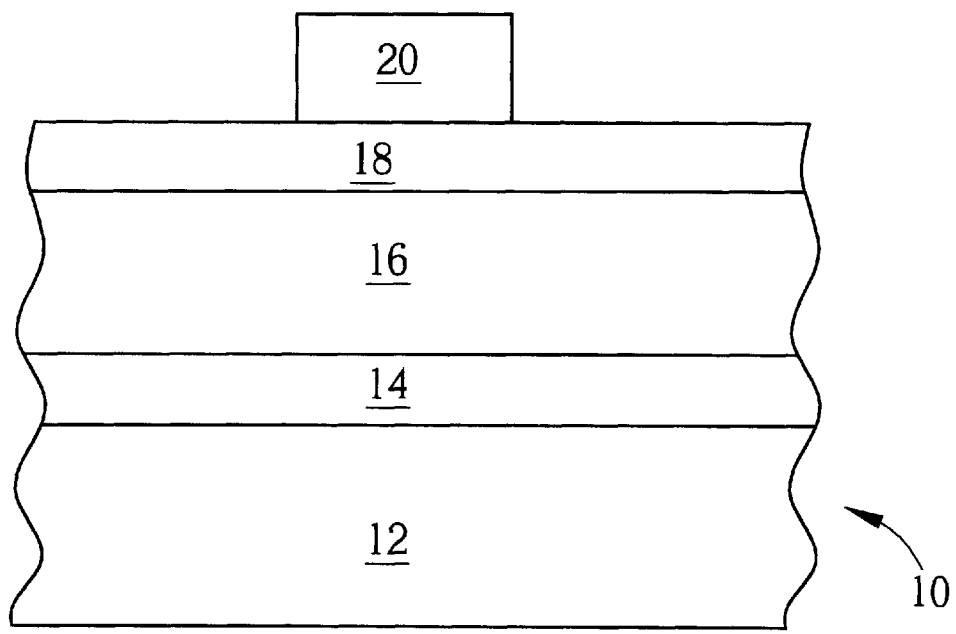
Figure 3:
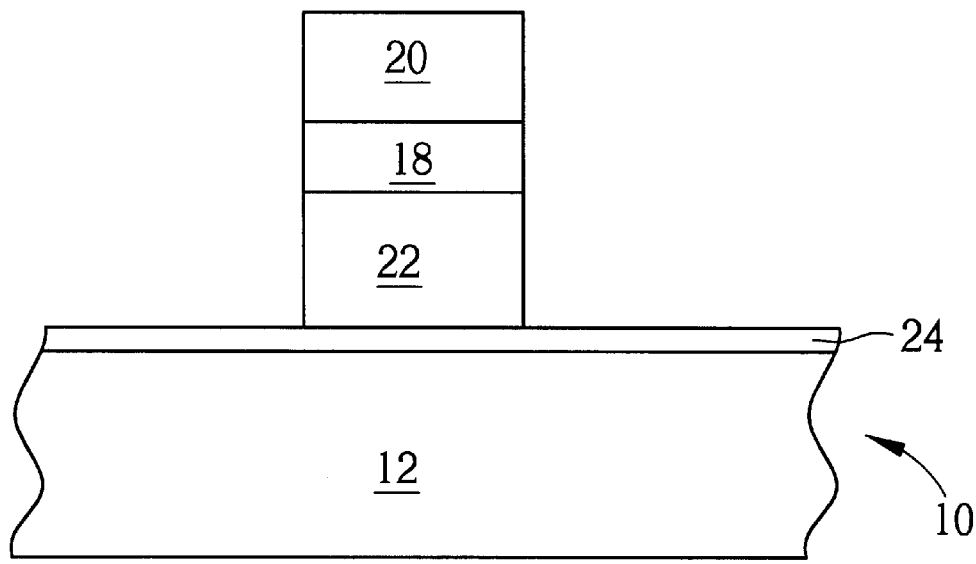
Figure 4:
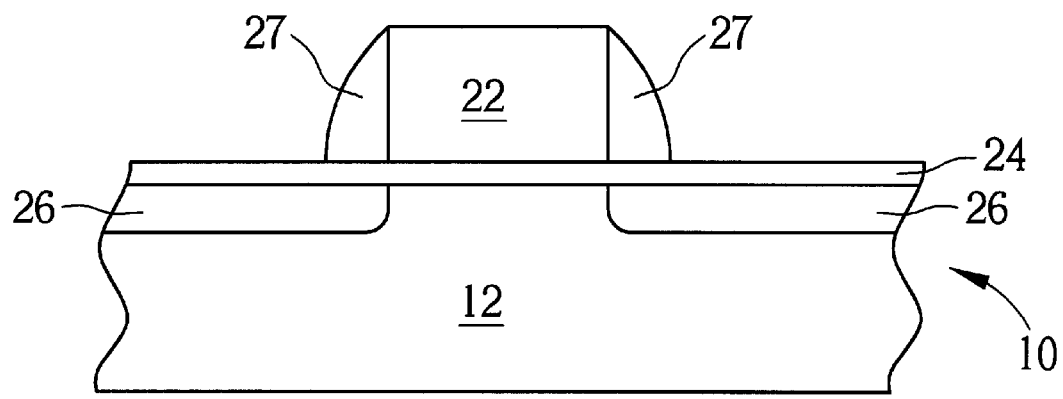
Figure 5:
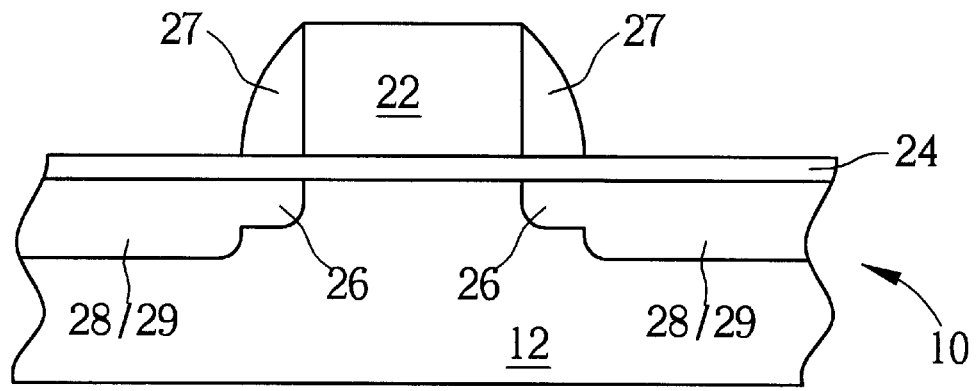
Figure 6:
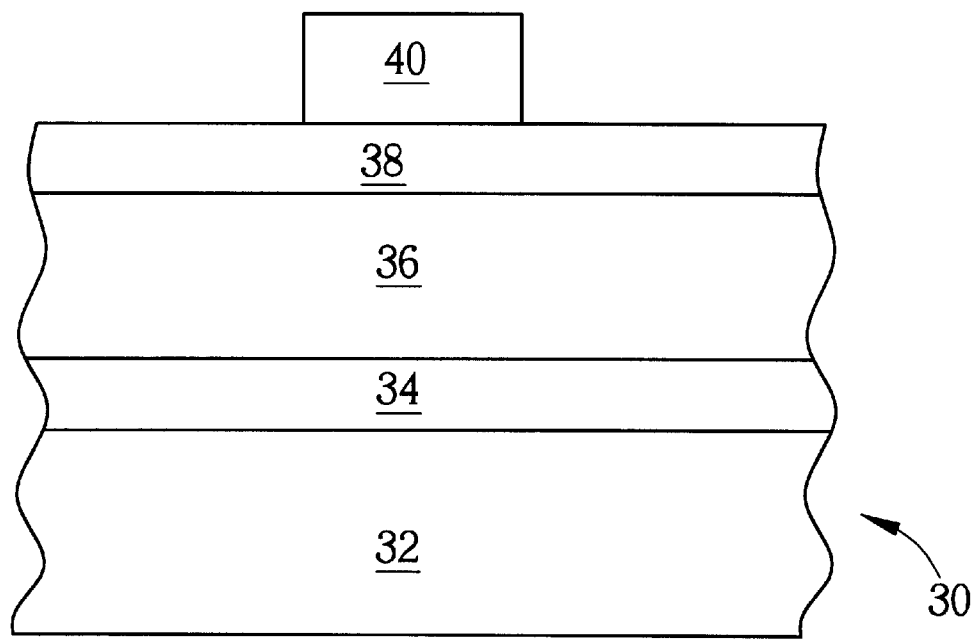
FIG. 6 to FIG. 10 are the cross-sectional views of forming a MOS transistor, according to the present invention to prevent fluorine ions from residing in a gate to result in boron ion penetration into a gate oxide on a semiconductor wafer.

Please refer to FIG. 6 to FIG. 10 of the cross-sectional views of forming a MOS transistor, according to the present invention. As shown in FIG. 6, in the preferred embodiment of the present invention, a substrate 32, an oxide layer 34, a conductive layer 36 composed of doped polysilicon, an anti-reflection coating (ARC) 38 composed of silicon-oxy-nitride ($SiO_xN_y$) and formed by a plasma-enhanced chemical vapor deposition (PECVD) process, and a photoresist layer 40 defining patterns of a gate 42 and positioned in a predetermined area on the ARC 38 are formed, respectively, on a semiconductor wafer 30.

Figure 7:
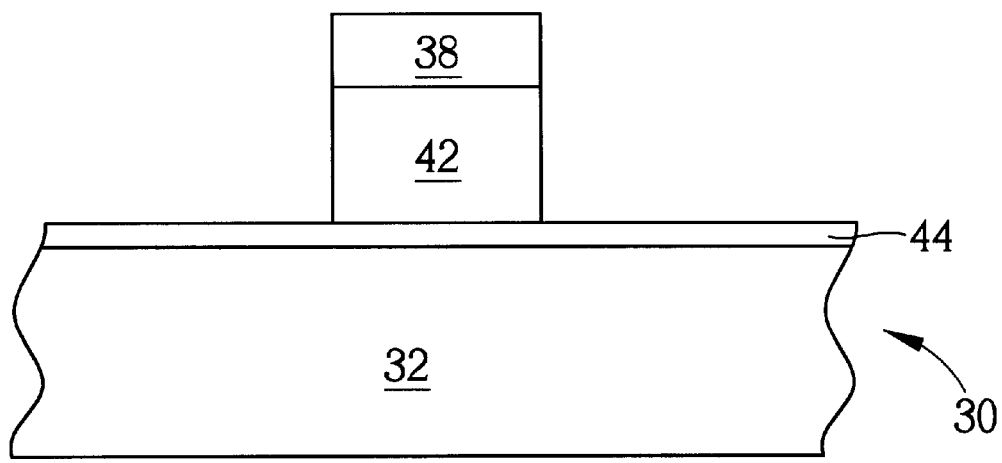
Figure 8:
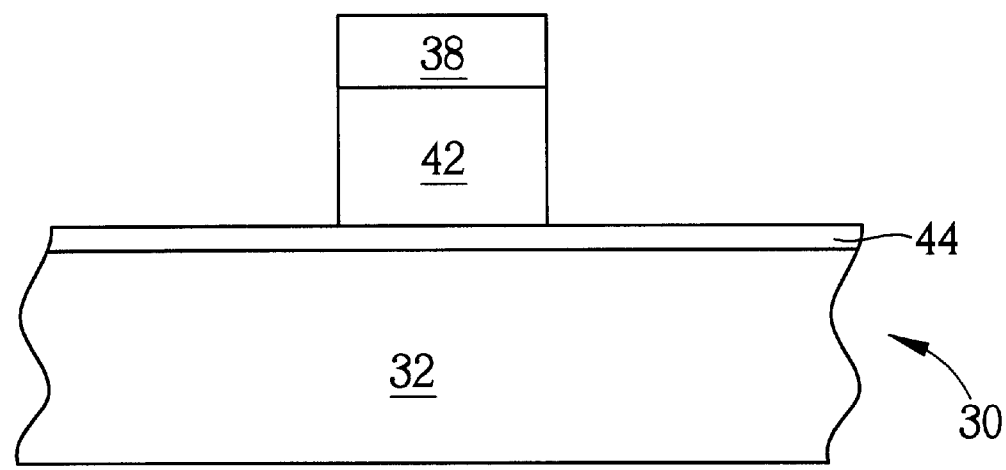

As shown in FIG. 7, an etching process is performed to remove portions of both the ARC 38 and the conductive layer 36 uncovered by the photoresist layer 40. The gate 42 and the gate oxide layer 44, composed of the remaining portions of both the conductive layer 36 and the oxide layer 34, respectively, are thus formed on the substrate 32. As shown in FIG. 8, a first ion implantation process is performed using the gate 42 covered by the ARC 38 as a hard mask and boron fluoride ($BF_2^+$) as the dopant to form lightly doped drains (LDD) 46 of the MOS transistor in the substrate 32 adjacent to the gate 42. The ARC 38 is used to prevent ions, especially fluorine ions, of the first ion implantation process from implanting into the gate 42 to result in boron (B) ion penetration into the gate oxide 44.

Figure 9:
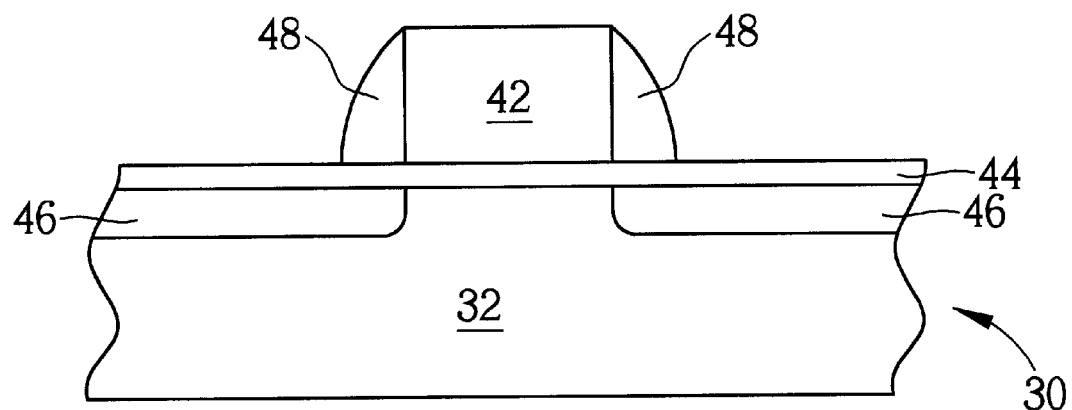
Figure 10:
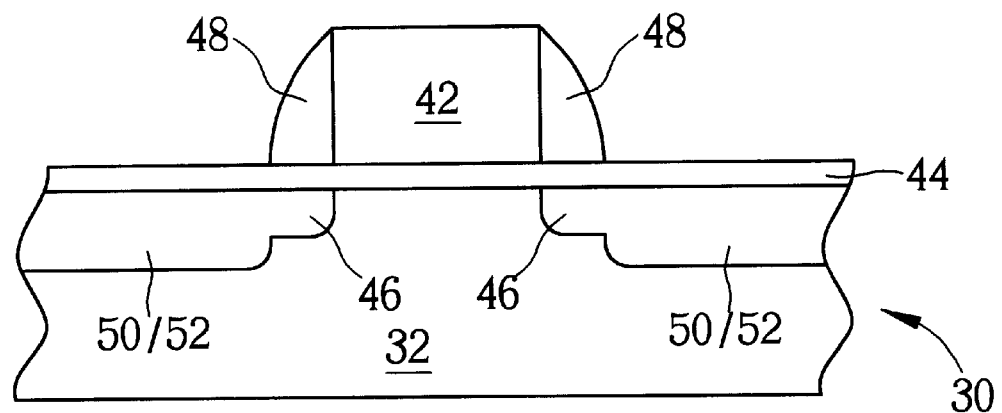

As shown in FIG. 9, after performing a wet etching process to strip the ARC 38, a spacer 48 is formed around the gate 42. Finally, as shown in FIG. 10, a second ion implantation is performed, using the gate 42 and the spacer 48 as a hard mask and boron as the dopant, to form a source 50 and a drain 52 of the MOS transistor in the substrate 32 around the spacer 48.

In comparison with the prior art, the present invention provides a method of preventing fluorine ions from residing in a gate to result in boron ion penetration into a gate oxide. In the present invention, the first ion implantation process forms the LDD of the MOS transistor in the substrate around the gate using the gate covered by the ARC as a hard mask and boron fluoride ($BF_2^+$) as the dopant. The ARC is used to prevent fluorine ions in the first ion implantation from implanting into the gate to result in boron ion penetration into the gate oxide, leading to threshold voltage change, leakage current, and capacitance-voltage curve distortion, in the subsequent processes. As a result, both the yield rate and electrical performance of the MOS transistor are thereby improved.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of preventing fluorine ions from residing in a gate to result in boron ion penetration into a gate oxide layer on a semiconductor wafer, the semiconductor wafer comprising a substrate, an oxide layer positioned on the substrate, and a conductive layer positioned on the oxide layer, the method comprising:

performing a plasma-enhanced chemical vapor deposition (PECVD) process to form an anti-reflection coating (ARC) on the conductive layer;

forming a photoresist layer on the ARC to define a pattern of the gate, performing an etching process to remove portions of the ARC and portions of the conductive layer that are not covered by the photoresist layer, with the residual conductive layer forming the gate, and the oxide layer forming the gate oxide layer;

stripping the photoresist layer;

using the ARC to protect the gate, and using boron fluoride ions as an ion source to perform an ion implantation process to form a lightly doped drain (LDD) in the substrate around the gate;

removing the ARC;

forming a spacer around the gate; and forming a source and a drain in the substrate adjacent to the spacer.

2. The method of claim 1 wherein the conductive layer is composed of doped polysilicon.

3. The method of claim 1 wherein the ARC is composed of silicon-oxy-nitride.

* * * * *